United States Patent
Cain et al.

(10) Patent No.: US 8,969,852 B2
(45) Date of Patent: Mar. 3, 2015

(54) ORGANIC ELECTRONIC DEVICES

(75) Inventors: Paul A. Cain, Cambridge (GB);
Henning Sirringhaus, Cambridge (GB);
Nicholas J. Stone, Cambridge (GB);
Thomas M. Brown, Rome (IT)

(73) Assignee: Plastic Logic Limited, Cambridge (GB)

( * ) Notice: Subject to any disclaimer, the term of this patent is extended or adjusted under 35 U.S.C. 154(b) by 2171 days.

(21) Appl. No.: 10/571,556

(22) PCT Filed: Sep. 10, 2004

(86) PCT No.: PCT/GB2004/003895
§ 371 (c)(1),
(2), (4) Date: Jul. 20, 2006

(87) PCT Pub. No.: WO2005/027216
PCT Pub. Date: Mar. 24, 2005

(65) Prior Publication Data
US 2007/0040170 A1    Feb. 22, 2007

(30) Foreign Application Priority Data

Sep. 12, 2003 (GB) .................... 0321383.2

(51) Int. Cl.
| H01L 35/24 | (2006.01) |
| H01L 51/00 | (2006.01) |
| H01L 29/76 | (2006.01) |
| H01L 29/94 | (2006.01) |
| H01L 27/28 | (2006.01) |
| B82Y 10/00 | (2011.01) |
| B82Y 30/00 | (2011.01) |
| H01L 51/05 | (2006.01) |

(52) U.S. Cl.
CPC ............... *H01L 27/28* (2013.01); *B82Y 10/00* (2013.01); *B82Y 30/00* (2013.01); *H01L 27/283* (2013.01); *H01L 51/052* (2013.01); *H01L 51/0004* (2013.01); *H01L 51/0036* (2013.01)
USPC ....... 257/40; 257/392; 257/393; 257/E27.061

(58) Field of Classification Search
CPC ............ H01L 51/0516; H01L 51/0545; H01L 51/0529; H01L 51/052; H01L 51/0525; H01L 51/0537; H01L 51/0533
USPC .............. 257/40, 66, 392, 393, 410, E25.008, 257/E27.061, E21.631
See application file for complete search history.

(56) References Cited

U.S. PATENT DOCUMENTS

| 3,700,981 | A |   | 10/1972 | Masuhara et al. |
| 4,021,835 | A | * | 5/1977  | Etoh et al. ................. 257/404 |
| 4,042,839 | A | * | 8/1977  | Araki ........................ 326/117 |

(Continued)

OTHER PUBLICATIONS

Kawase et al., Inkjet Printed Via-Hole Interconnections and Resistors for All-Polymer Transistor Circuit, Adv. Mater. 2001, 13, No. 21, pp. 1610-1605.*

(Continued)

*Primary Examiner* — Shouxiang Hu
(74) *Attorney, Agent, or Firm* — Sughrue Mion, PLLC

(57) ABSTRACT

An electronic device including at least first and second transistors integrated together on a substrate and each including an organic semiconductor region, wherein the first and second transistors are either both n-type or both p-type but wherein one of the first and second transistors is a normally-ON transistor and the other of the first and second transistors is a normally-OFF transistor.

7 Claims, 14 Drawing Sheets

(56) References Cited

U.S. PATENT DOCUMENTS

| | | | |
|---|---|---|---|
| 4,348,746 A | * | 9/1982 | Okabayashi et al. .......... 365/182 |
| 4,615,102 A | * | 10/1986 | Suzuki et al. ................ 438/172 |
| 5,250,388 A | | 10/1993 | Schoch, Jr. et al. |
| 2003/0059975 A1 | | 3/2003 | Sirringhaus et al. |

OTHER PUBLICATIONS

W. Fix, et al., "Fast polymer integrated circuits based on a polyfluorene derivative", Proceedings of the European Solid State Device Research Conference (ESSDERC), Edition Frontiers, GIL-SUR-YVETTE, FR, Sep. 24, 2002, pp. 527-529, XP008032771.

Cheon An Lee, et al., "Full-Swing Pentacene Organic Thin-Film Transistor Inverter with Enhancement-Mode Driver and Depletion-Mode Load", Device Research Conference, 2004, 62$^{nd}$ DRC. Conference Digest 'Late News Papers Volume included' Notre Dame, IN, USA, Jun. 21-23, 2004, Piscataway, NJ, USA, IEEE, Jun. 21, 2004, pp. 181-182, XP010748200.

C. D. Dimitrakopoulos, et al., "Organic thin-film transistors: A review of recent advances", IBM Journal of Research and Development, IBM Corporation, Armonk US, vol. 45, No. 1, Jan. 1, 2001, pp. 11-27, XP001150345.

Yen-Yi Lin, et al., "Pentacene-Based Organic Thin-film Transistors", IEEE Transactions on Electron Devices, IEEE Inc., New York, US, vol. 44, No. 8, Aug. 1997, pp. 1325-1331, XP000658337, ISSN: 0018-9383.

H. Okuzaki, et al., "Characteristics of conducting polymer transistors prepared by line patterning", Synthetic Metals 137 (2003) 947-948, International Conference on Science and Technology of Synthetic Metals, Jun. 29-Jul. 5, 2002, Apr. 4, 2003, XP002335369, Shanghai China, Synthetic Metals Elsevier, Switzerland.

T. Li, et al., "Channel formation in organic field-effect transistors", Journal of Applied Physics, vol. 91, No. 7, Apr. 1, 2002, pp. 4312-4318.

Hagen Klauk, et al., "Pentacene Thin Film Transistors and Inverter Circuits", IEDM 97, 539-542, Dec. 1997.

\* cited by examiner

P3HT/PMMA

ORGANIC ELECTRONIC DEVICES

This invention relates to the design and fabrication of electronic devices, particularly integrated transistor circuits based on polymeric or organic semiconductors.

Semiconducting conjugated polymer thin-film transistors (TFTs) have recently become of interest for applications in cheap, logic circuits integrated on plastic substrates (C. Drury, et al., APL 73, 108 (1998)) and optoelectronic integrated devices and pixel transistor switches in high-resolution active-matrix displays (H. Sirringhaus, et al., Science 280, 1741 (1998), A. Dodabalapur, et al. Appl. Phys. Left. 73, 142 (1998)). Charge carrier mobilities up to 0.1 cm$^2$/Vs and ON-OFF current ratios of $10^6$-$10^8$ have been reached, which is comparable to the performance of amorphous silicon TFTs (H. Sirringhaus, et al., Advances in Solid State Physics 39, 101 (1999)).

Most conjugated polymers or small molecules are p-type semiconductors, i.e. the hole field-effect mobility is by orders of magnitude higher than the electron field-effect mobility. In many cases this is a result of the sensitivity of many organic semiconductors to impurities such as atmospheric oxygen or moisture, or impurities incorporated into the material during processing and synthesis. Since the electron affinity of many conjugated organic semiconductors is relatively small, i.e. typically on the order of 2.5-3.5 eV impurities such as oxygen provide efficient traps for electrons removing mobile electrons from the conduction band (the lowest unoccupied molecular orbital LUMO). The highest hole mobilities in polymer semiconductors such as poly(3-hexylthiophene) (P3HT) are on the order of 0.1 cm$^2$/Vs, for molecular semiconductors such as pentacene hole mobilities of up to 5 cm$^2$/Vs have been reported. In these materials electron mobility is often less than $10^{-3}$ cm$^2$/Vs. Another reason for the poor n-type field-effect conduction is the difficulty of efficiently injecting electrons into the organic semiconductor from common, environmentally stable source-drain electrodes of inorganic metal electrodes, such as gold or silver, or conducting polymer electrodes such as poly-ethylene-dioxythiophene doped with poly-styrene-sulfonate (PEDOT/PSS) or polyaniline (PANI). A few n-type semiconductors that have useful mobilities have been reported, most of which are molecular semiconductors, since molecular semiconductor can be purified more efficiently, and do therefore typically contain a lower concentration of impurities than polymers (Bao, et al., Appl. Phys. Lett. 69, 3066 (1996)). Only very few n-type polymers have been reported, and they suffer from problems such as poor environmental stability or need to be deposited by techniques that do not lend themselves to large-scale manufacturing (A. Babel, Adv. Mat. 14, 371 (2002).

For these reasons most logic circuits based on organic semiconductors reported in the prior art have been based on p-type semiconductors only. (Drury et al., Appl. Phys. Lett. 73, 108 (1998)). Complementary circuits incorporating both n-type and p-type semiconductor have only been demonstrated with small molecule n-type semiconductors, such as fluorinated copper phtalocyanine (Crone, Nature 403, 521 (2000)). CMOS-type organic semiconductor circuits offer advantages of (a) low power dissipation, because there is no static current flowing through the basic inverter stage when the device is not switching, and (b) high gain. However, for the reasons outlined above CMOS circuits are difficult to realize, and the n-type semiconducting components tend to suffer from poor environmental stability when exposed to atmospheric oxygen or moisture.

Several different configurations for the basic inverter stage in all p-type logic circuits have been realized in the prior art including resistor-load, enhancement and depletion load devices (Kawase et al., Adv. Mat. 13, 1601 (2001)). In the resistor-load configuration a normally-OFF TFT is used in combination with a resistor load, the resistance of which is adjusted such that it is larger than the resistance of the TFT in its ON state (FIG. 1C). In the enhancement-load or depletion-load configuration two p-type TFTs are used as the switching and the load transistors. The enhancement-load configuration (FIG. 1B) needs to be used for normally OFF TFTs, that have a negative turn-on voltage, and do not conduct at gate voltage $V_g$=0V. In the enhancement-load configuration the load transistor operates in the triode region, i.e. $V_d$=$V_g$. Therefore, the gain of an enhancement-load inverter stage is small, i.e. typically on the order of 1. Alternatively, depletion load logic can be used if the TFTs have a positive turn-on voltage, i.e. the device is normally ON and conducts at $V_g$=0V. The depletion load configuration offers higher gain. However, it requires level shifting in circuits where switching of one logic stage by another logic stage is required. The output voltage of a depletion-load device operating between 0V and $-V_{DD}$ cannot be positive, i.e. the output of one stage cannot turn off the switching transistor of the next stage (see FIG. 1A). The two transistors of the basic inverter stage in the circuits fabricated in the prior art ((Drury et al., Appl. Phys. Lett. 73, 108 (1998)) were made from the same materials, have the same architectures and electrical characteristics, i.e. they were either normally on or normally off. The switching and the load transistor mainly differ in terms of geometrical dimension. For example, in the depletion load device the load transistor is typically fabricated with a larger channel width or a smaller channel length to ensure sufficient conduction of the load transistor to bring the output voltage to $V_{DD}$ while the switching transistor is off.

Historically, in silicon integrated circuits p-MOS or n-MOS logic has been used very successfully before the arrival of CMOS. The basic inverter configuration of a silicon PMOS device consists of two different transistors, a normally-OFF, enhancement-type switching transistor, and a normally-ON, depletion-type load transistor. We call this type of logic here enhancement-depletion configuration. This configuration provides the ability to design chains of logic stages without level shifting. At the same time the basic PMOS inverter stage has a high gain, because the load device is operated in the saturation regime ($V_g$=0V). In the case of silicon MOS devices the turn-on voltage of the two normally-ON and normally-OFF transistors can be adjusted by controlled doping of the active semiconducting channel by techniques such as ion implantation.

In the absence of reliable, and environmentally stable CMOS devices based on organic semiconductors it would be highly desirable if high-gain enhancement-depletion logic devices could be fabricated with organic semiconducting materials. The high gain that would be achievable in such configurations is required for applications in digital logic, and particularly for analogue amplifiers for applications in sensors. In an organic sensor device a small output voltage or current generated by a sensing element in response to a chemical, biological or physical stimulus needs to be amplified and converted into a digital signal that can be processed by a digital logic circuit.

Fabrication of organic semiconductor logic circuits in configurations equivalent to silicon PMOS have not been reported yet. This is because controlled doping of organic semiconductors is difficult to achieve. Chemical doping techniques can be used to change the conductivity of organic semiconductors, but the counterions introduced into the organic semiconductor are mobile and can drift under the influence of applied electrical fields. This is because chemical dopants occupy interstitial sites, and are not covalently bound to the semiconductor unlike in inorganic semiconductors where dopants are covalently incorporated into the lattice on substitutional or interstitial sites.

It is an aim of the present invention to provide a new technique for providing normally-ON and normally-OFF transistors of either both n-type or both p-type integrated together on a substrate.

According to one aspect of the present invention, there is provided an electronic device including at least first and second transistors integrated together on a substrate and each including an organic semiconductor region, wherein the first and second transistors are either both n-type or both p-type but wherein one of the first and second transistors is a normally-ON transistor and the other of the first and second transistors is a normally-OFF transistor.

According to another aspect of the present invention, there is provided A method of producing an electronic device including at least first and second transistors integrated on a substrate, the method including forming at least one element (or a precursor thereto) of each of the first and second transistors by a process including liquid-phase deposition, wherein the first and second transistors are either both n-type or both p-type but wherein one of the first and second transistors is a normally-ON transistor and the other of the first and second transistors is a normally-OFF transistor.

Embodiments of the present invention include methods and circuit configurations that allow the fabrication of analog and digital circuits based on organic semiconductor enhancement-depletion type logic stages and analogue amplifiers. The invention discloses how normally-ON and normally-OFF organic transistors can be integrated together onto the same substrate enabling the fabrication of inverters and amplifiers with a high gain comparable to that of complementary circuits.

Embodiments of the invention will now be described in more detail, by way of example only, with reference to the accompanying drawings.

A first embodiment of the present invention is an integrated circuit comprising normally-ON TFTs and normally-OFF TFTs integrated on the same substrate wherein the normally-ON TFTs have a different gate dielectric than the normally-OFF TFTs.

Most TFTs based on organic semiconductors reported in the prior art are normally-OFF, unless the semiconducting layer is extrinsically doped due to the presence of atmospheric or synthetic impurities. This is expected, since the flat band voltage of a metal-insulator-semiconductor device with identical source/drain and gate contacts and intrinsic semiconductor layer should be very close to zero volts.

We have discovered however, that the turn-on voltage for a given semiconductor material can depend significantly on the choice of gate dielectric.

Figure 1:
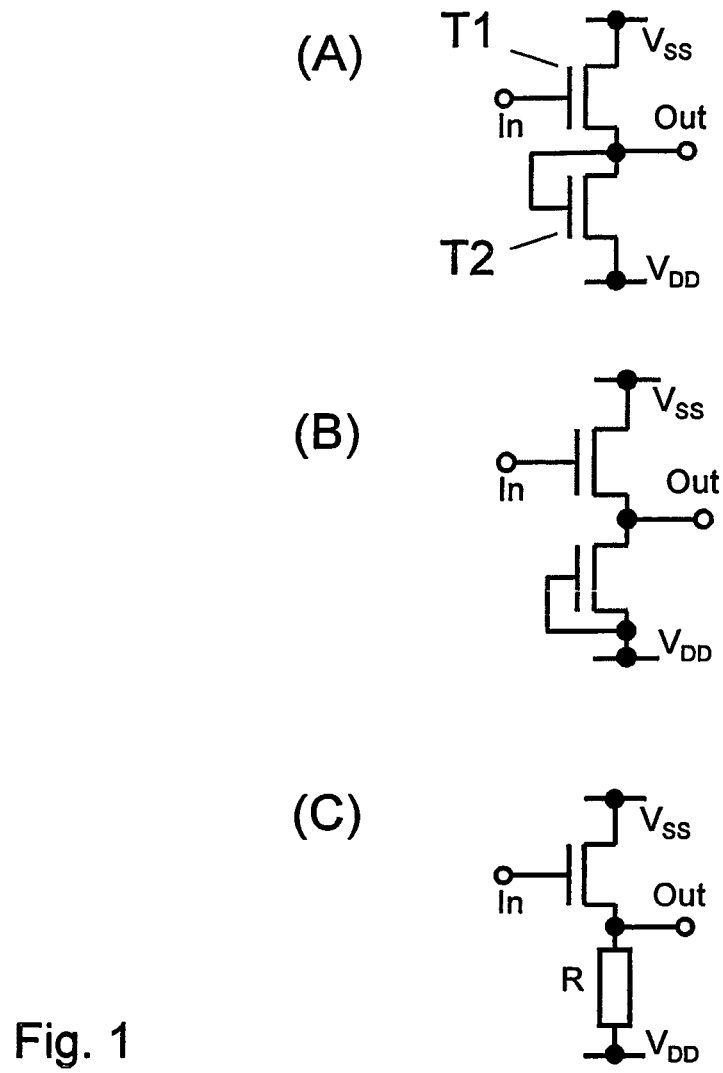
FIG. 1 shows a schematic diagram of different inverter configurations according to the prior art.
Figure 2:
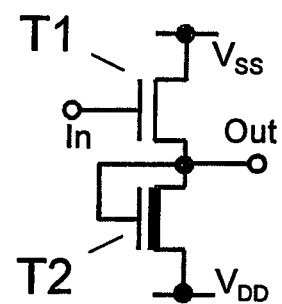
FIG. 2 shows a schematic diagram of an enhancement-depletion inverter according to an embodiment of the present invention.
Figure 3:
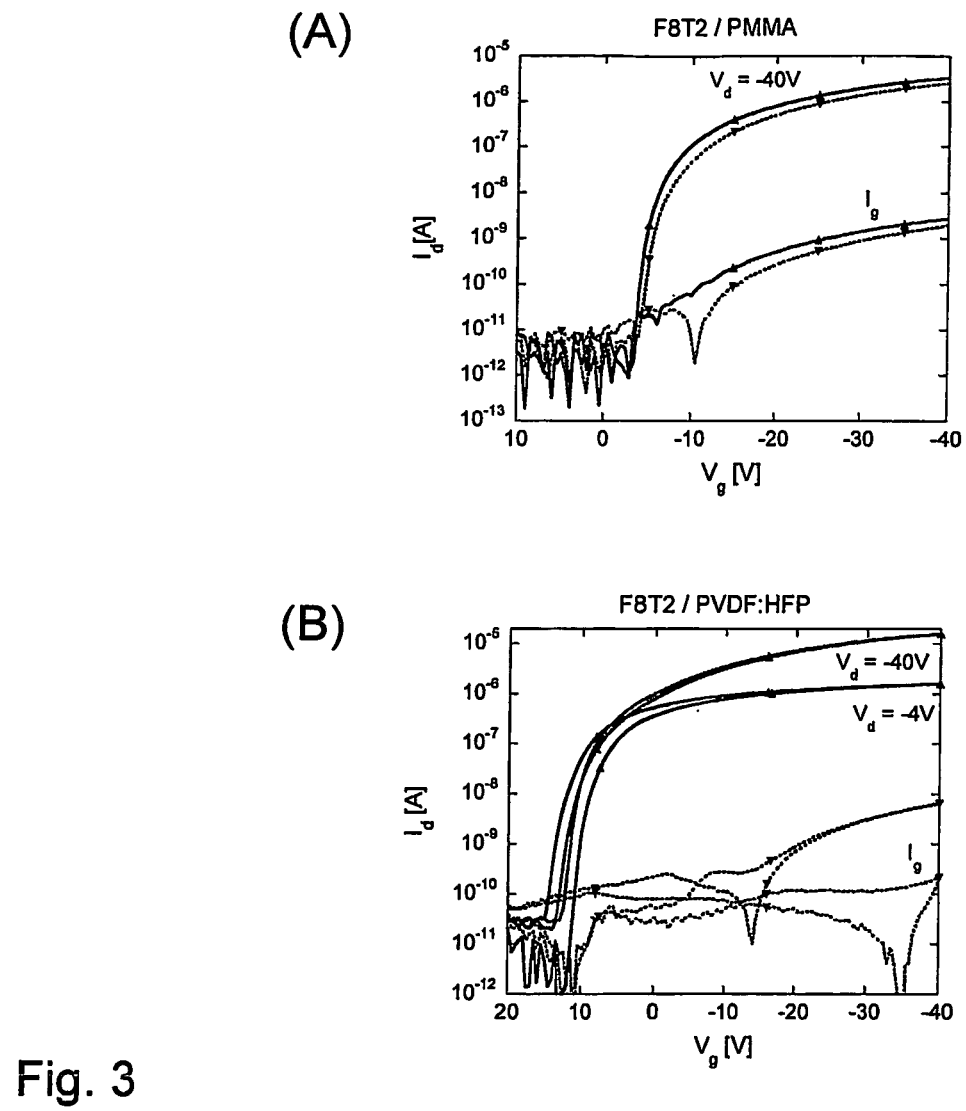
FIG. 3 shows transfer characteristics of F8T2 polymer TFTs showing normally-ON behaviour with PVDF-TFE gate dielectric, and normally-OFF behaviour with PMMA gate dielectric according to an embodiment of the present invention.

FIG. 3 shows transfer characteristics of two top-gate TFTs with gold source-drain and gate electrodes, semiconducting layer of poly(dioctylfluorene-co-bithiophene) (F8T2). If a gate dielectric of polymethylmethacrylate (PMMA) is used the device is normally off with a turn-on voltage $V_0$ of 0 to −10V. However, if a gate dielectric layer of poly(vinylidene-fluoride) copolymerized with hexafluoropropylene (PVDF-HFP) is used the turn-on voltage becomes positive, and the device is normally-on with $V_0$=+5 to +20V.

Without wanting to be bound by theory the normally-on behaviour in the PVDF-HFP devices is believed to be due to the strongly electronegative nature of a fluoropolymer gate dielectric. The fluorine atoms at the active semiconductor-dielectric interface stabilize the formation of a hole accumulation layer at the interface, possibly by providing acceptor-like interface states that shift the turn-on voltage to more positive voltages.

Similar positive turn-on voltages were observed with other gate dielectrics such as polyvinylphenol (PVP). In the case of PVP the negative turn-on voltage might be related to the presence of polar, negatively charged hydroxyl groups present in the polymer.

Other electron withdrawing groups such as, but not limited to, those containing chlorine, bromine, cyano-groups might be used to similar effect. Analogously, in the case of n-type semiconductors, electron donating groups, such as groups containing a metal atom, such as an alkali metal, can be incorporated into the dielectric material in contact with the semiconducting layer.

In another embodiment there is used a polymer dielectric that has the ability to form a ferroelectric phase exhibiting a macroscopic polarisation. If the film polarised uniaxially with the polarisation direction normal to the film plane, the polarisation shifts the flat-band voltage of the device. Depending on the orientation of the polarisation the shift of the turn-on-voltage can either be positive or negative.

An example of such a ferroelectric polymer is PVDF and its copolymers (Prest, J. Appl. Phys. 49, 5042 (1978)). The uniaxial polarisation can be induced by annealing the polymer into its ferroelectric phase. Preferably, annealing is performed in the presence of an aligning field such as an electric poling field applied between the source/drain and gate electrodes of the transistor.

An alternative route to controlling the turn-on voltage of the TFTs by using different gate dielectrics is to use a gate dielectric that forms an ordered self-assembled layer structure. Preferably, a lamellar structure is formed in which the portion of the gate dielectric that adjoins the active semiconductor-dielectric interface has a different chemical structure than the layer adjoining the interface between the gate dielectric and the gate electrode.

A preferred class of dielectrics by which such lamellar structures can be formed are diblock or triblock copolymers which spontaneously self-assemble into lamellar structures with layers being oriented in the plane of the film. Such lamellar architectures provide the ability to independently tune the electronic and chemical properties of the semiconductor-dielectric and dielectric-gate interface, such as to provide the required turn-on voltage, and also exhibit good wetting properties, for example for the printing deposition of the gate electrode on top of the surface of the gate dielectric in the case of a top-gate architecture.

An example of such a block copolymer is a blockcopolymer comprising a block of polystyrene and a semifluorinated block (J. Wang et al., Macromolecules 30, 1907 (1997), D. Iyengar et al., Macromolecules 29, 1229 (1996), T. Hayakawa, et al., Macromolecules 33, 8012 (2000)). The fluorinated block has the lower surface energy and is driven to the surface during solution deposition. For normally-ON devices it is preferred that the device is formed in a bottom gate configuration, such that the fluorinated block forms the active dielectric-semiconductor interface.

Similar effect can be achieved by using a double layer gate dielectric for example using a fluoropolymer as a first dielectric layer and a PMMA polymer as a second dielectric layer. In this case care needs to be taken to avoid dissolution of the dielectric layer that is deposited first in the solvent of the second layer. This can be achieved by choice of orthogonal solvents (U.S. Ser. No. 10/176,007). Alternatively, the first dielectric can be converted into an insoluble form prior to deposition of the second dielectric either by using a precursor polymer or by mixing a crosslinking agent into the solution of the first polymer.

Figure 4:
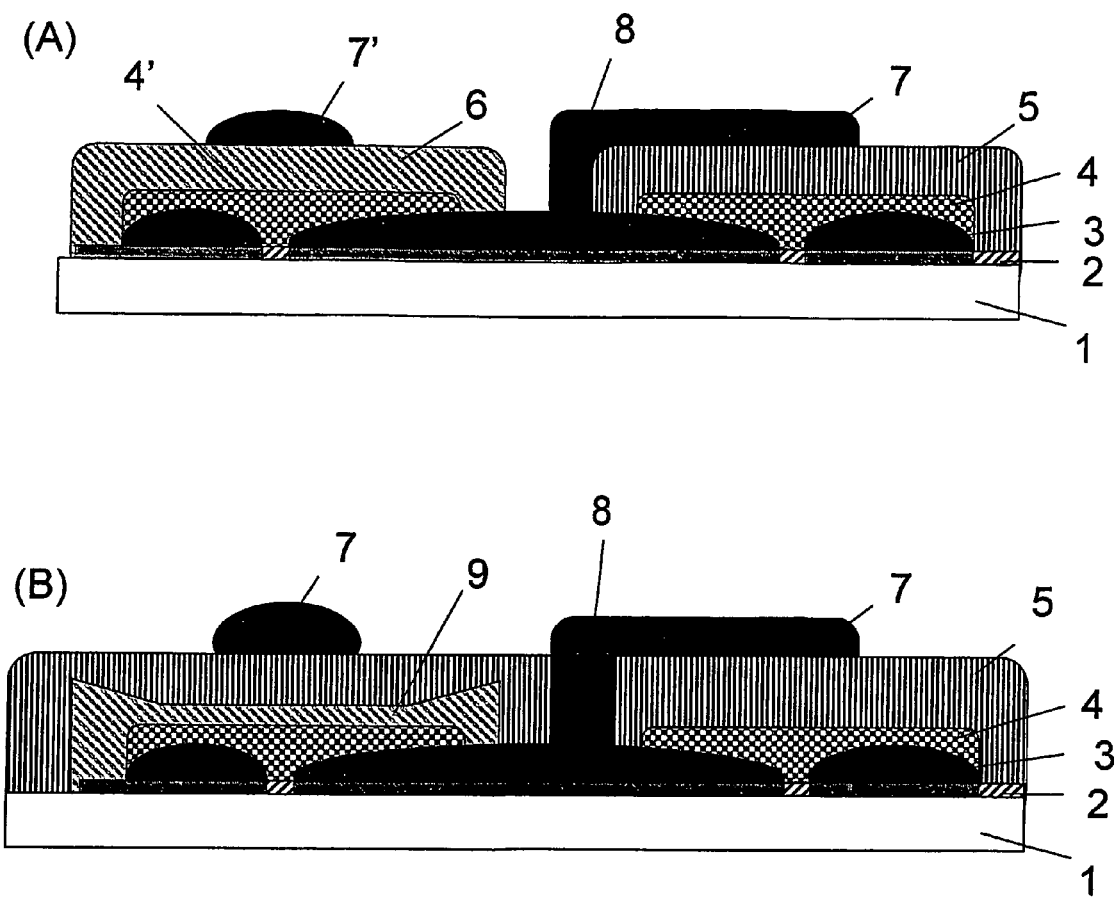
FIG. 4 shows a schematic diagram of an enhancement-depletion load inverter with patterned gate dielectric using two separately patterned gate dielectrics (A), and one patterned gate dielectric and a continuous layer of a second dielectric coated on top (B).

Fabrication of enhancement-depletion type logic circuits based on TFTs with different gate dielectrics requires patterning of at least one of the two gate dielectrics (FIG. 4). Preferably, patterning is performed by a solution-based direct printing technique such as, but not limited to inkjet printing, screen printing, flexographic printing, offset printing, laser printing, or laser forward transfer printing. Alternatively, techniques such as photolithographic patterning might be used. Most preferably, patterning is performed by ink jet printing. FIG. 4A shows a schematic diagram for a simple PMOS inverter using top gate TFTs fabricated by patterning the dielectric layer of both the normally-ON and that of the normally-OFF device.

On a substrate 1 a source-drain electrode array 3 is printed. For the high-resolution definition of critical features a surface energy pattern might be used. Then the semiconducting active layer island 4, 4' is deposited. Subsequently, the gate dielectrics 5 for the normally ON device and 6 for the normally OFF device are deposited as patterned layers. Then the gate electrodes 7, 7' are defined.

In this configuration the interconnection 8 between the gate electrode and the source electrode of the load transistor can be fabricated, for example, by printing over the edge of the gate dielectric island of the load transistor without requiring a via-hole interconnections.

In this case it is preferable that the thickness profile of the two dielectric islands is sufficiently uniform over the active channel area of the transistors. For solution-based printing techniques this may require control over the drying mode of the printed solution on the surface. A uniform drying mode is preferred compared to a "coffee-stain" drying mode, where most of the material is deposited near the edge of the drying droplet. The drying mode can be controlled by the choice of solvent from which the dielectric material is deposited, the amount of liquid that is deposited onto the substrate, and the printing pattern, by the control of the substrate surface energy, and substrate temperature, as well as the atmosphere in which the solution is deposited.

An alternative variation is shown in FIG. 4B. In this case a patterned dielectric layer 9 is deposited onto the active semiconducting layer of only one of the two transistors. Then a continuous layer 5 of a second dielectric is deposited from a solution that does not interact with any of the previously deposited layers. In this case one of the two transistors is formed with a double layer dielectric. This configuration has the attractive feature that good performance transistors can be achieved even if the thickness profile of the first patterned dielectric is not completely uniform in the active area of the transistor. This is because the second dielectric can be deposited in such a way that it planarizes any topographic profile that might have been generated by the patterning of the first dielectric. The first dielectric is formed as a thin film, i.e. its thickness preferably is less than the thickness of the second dielectric layer.

The latter device configuration involves formation of a via hole interconnections 8 through the continuous gate dielectric layer 5. Via-holes can be formed by a range of different processes including, but not limited to, solvent printing (U.S. Ser. No. 10/176,173), laser ablation, mechanical hole punching, or photolithography followed by etching.

Care should be taken to ensure good uniformity of the thickness profile of the gate dielectric across the active area of the device. This may require careful control of the drying mode of the deposited solution pattern. It is desirable that the thickness of the dielectric layer island that is typically on the order of 10-1000 nm is as homogeneous as possible over the dimension of the device.

Commonly in the case of low surface tension inks the ink tends to dry in a coffee-stain drying mode, where the contact line becomes pinned and a flow of liquid and material towards the edge of the droplet is established. This flow is driven by the higher rate of liquid evaporation near the edge of the droplet than in its centre. Material is therefore deposited preferentially at the edges of the droplet (FIG. 4B). In most cases, this is undesirable, as it results in very thin, and possibly discontinuous films in the central regions of the deposited island. It also increases the tendency of the material to dewet from the very thin central region.

Coffee-stain drying can be prevented by increasing the viscosity of the solution, by reducing the evaporation time, for example by using lower boiling point solvents, deposition at elevated temperature, exposing the substrate to electromagnetic radiation during deposition and drying, or by flowing a stream of "dry" inert gas over the substrate during deposition. In this way a highly viscous solution state is reached more quickly before all the material has flown to the edges of the droplet.

Another embodiment of the present invention is an integrated circuit comprising normally-ON TFTs and normally-OFF TFTs integrated on the same substrate wherein the normally-ON TFTs have a different active semiconductor than the normally-OFF TFTs.

Figure 5:
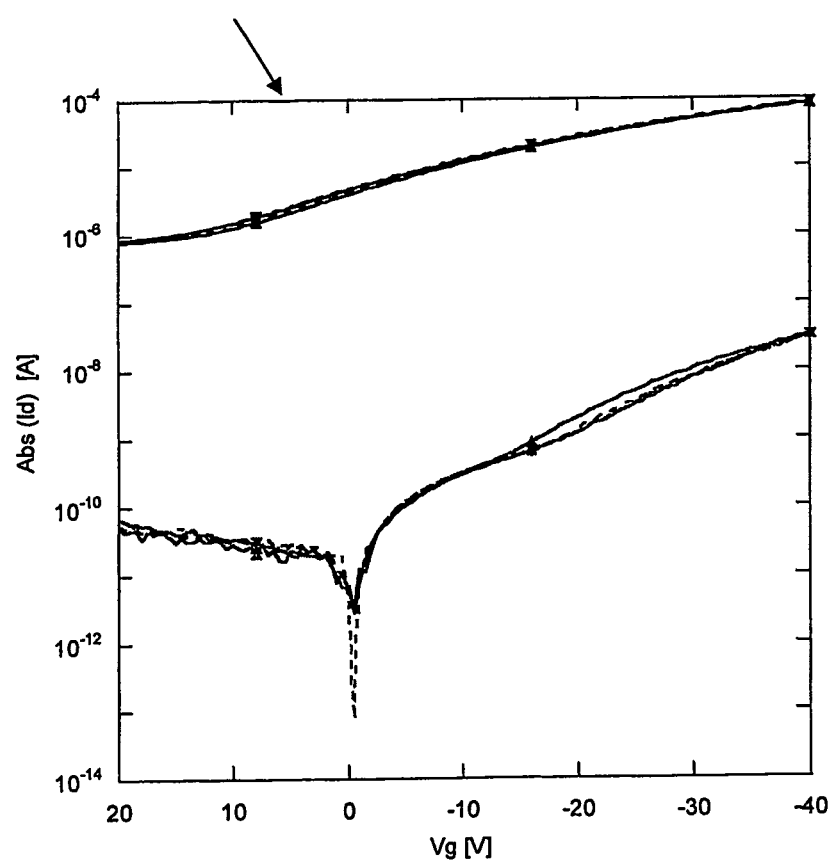
FIG. 5 shows transfer characteristics of polymer TFTs with polystyrene, gate dielectric showing normally ON behaviour with P3HT semiconducting layer.

It has been observed that some organic semiconductors exhibit normally ON behaviour, while other undoped organic semiconductors exhibit normally OFF behaviour in device configurations with identical electrodes and gate dielectric. FIG. 5 shows transfer characteristics of a top-gate TFT with gold source-drain and gate electrodes, a gate dielectric of PMMA, and semiconducting layer of P3HT. The P3HT device is normally-ON with a turn on voltage of $V_0$=+10V, while a corresponding device using F8T2 is normally-OFF.

The normally-ON behaviour of P3HT devices is observed in several device configurations, while in other device configurations P3HT also exhibits normally-OFF behaviour. Device configurations for which normally-ON behaviour of P3HT devices was observed include, but are not limited to:

Most top gate device configurations with dielectric such as PMMA, polyvinylphenol (PVP).

Bottom gate configurations in which the dielectric layer had been modified prior to deposition of the semiconducting layer by an electron withdrawing self-assembled monolayer, including but not limited to fluorinated self-assembled monolayers such as 1H,1H,2H,2H-perfluorodecyletrichlorosilane (FDTS).

Device configurations with fluoropolymer gate dielectrics, such as Teflon or PVDT-TFE gate dielectrics.

The P3HT used here has a low bulk conductivity and low residual doping level, when exposure to air is avoided by processing and measurement under inert nitrogen conditions. The normally ON behaviour in these configurations is associated with the formation of an accumulation layer at the semiconductor-dielectric interface, for example, induced by the presence of electron accepting states, or fixed negative charges at the semiconductor-dielectric interface. If the ionisation potential of the semiconducting layer is not too high generation of such defects will result in formation of mobile hole carriers at the interface shifting the turn-on voltage of the device to more positive values.

Similar normally-ON behaviour is also observed in other p-type semiconductors, such as pentacene, with relatively low ionisation potential, of typically less than 5.1 eV (ionisation potential of P3HT≈4.9-5.1 eV). Polymer semiconductors with higher ionisation potential>5.3 eV, such as F8T2 typically show normally-OFF behaviour in the same device configurations. Therefore, if an organic semiconductor with a low ionisation potential is used together with an organic semiconductors with an ionisation that is higher by at least 0.2 eV under the same environmental conditions, the device with the low-ionisation potential semiconductor is normally-ON, while the transistor with the higher ionisation potential semiconductor is normally OFF.

According to one variation, the normally-ON behaviour of one of the two transistors can be produced by using a doped semiconducting material. The doping might occur, for example, during the synthesis or storage of the semiconductor, by incorporation of a dopant molecule into a solution of the semiconducting material, by exposure of the completed device to a gaseous or liquid dopant, or simply by exposure of the completed devices to the atmosphere. In the latter two cases the doping process must be selective, i.e., one of the two semiconducting layers is susceptible to doping but the other semiconducting layer is inert against the doping procedure applied. Preferably, in the case of p-type doping the doped semiconductor has a lower ionisation potential than the semiconductor that is inert against doping. An example of a combination of such semiconductors is P3HT which is easily doped by exposure to air, and F8T2 which is more inert when exposed to air.

The selective doping process can also be performed by local exposure of the normally-ON devices to a dopant solution. For example, a solution containing a dopant molecule can be deposited selectively onto the active region of the normally-ON devices by techniques such as inkjet printing, screen printing, offset printing, flexographic printing, and lithographic masking, and other patterning techniques. Examples for p-type dopant solutions include solutions containing ferric chloride, sulphonic acid derivatives, and other negative counterion dopants known in the prior art.

Another variation is an integrated circuit incorporating a pair of TFTs comprising an inverter, wherein the load transistor and the switching transistor are arranged such that one of the transistors is in a top-gate configuration and the other is in a bottom-gate configuration. This arrangement is shown in FIG. 6.

Figure 6:
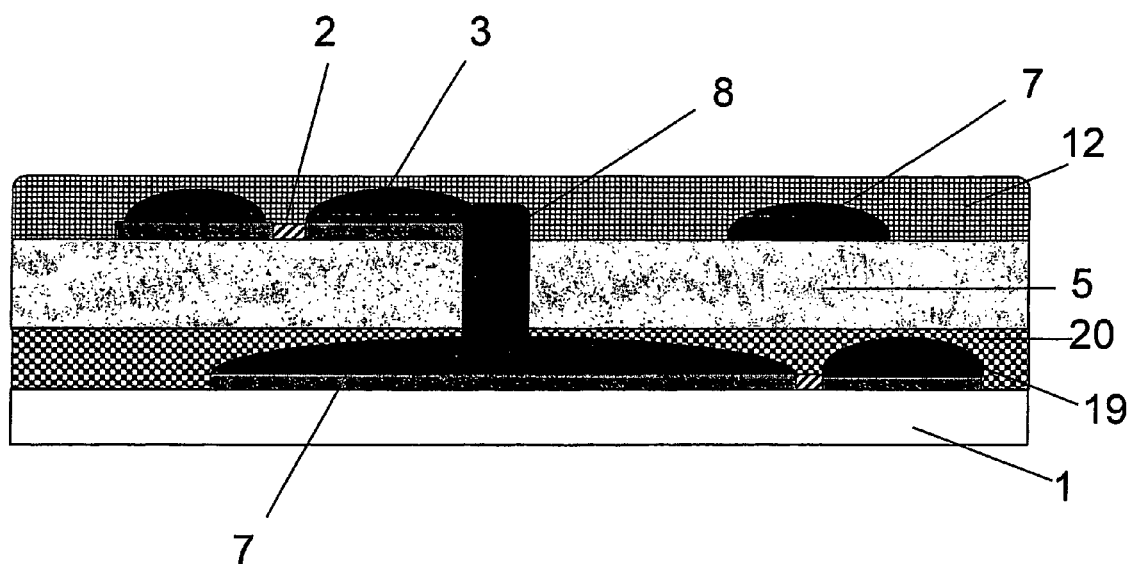
FIG. 6 illustrates a schematic diagram of an enhancement-depletion load inverter using two unpatterned semiconducting layers according to an embodiment of the present invention.

FIG. 6 illustrates two TFTs integrated on the same substrate, wherein the normally-ON TFT has a different active semiconductor material to the normally-OFF TFT. In both cases, an active semiconductor material is unpatterned. The semiconductor material 20 is deposited as a continuous layer onto the source and drain electrodes 19 of the load-transistor and onto the gate electrode 7 of the input-transistor. Then a continuous layer 5 of a dielectric material is deposited from solution that does not interact with the previously deposited layer. Upper electrodes may then be deposited to form the gate electrode 7 of the load-transistor and the source and drain electrodes 2, 3 of the input-transistor, followed by the deposition of a second semiconductor layer 12. This configuration has the advantage of incorporating unpatterned semiconductor layers 12, 20 without compromising device performance, particularly if the gate electrode is as thick as or even thicker than the unused semiconductor layer within which it resides.

Figure 7:
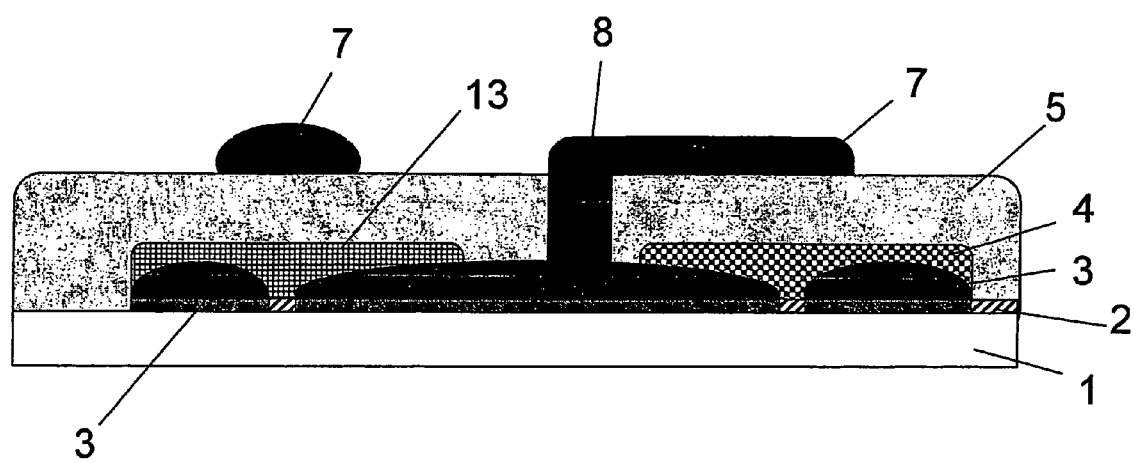
FIG. 7 shows a schematic diagram of an enhancement-depletion load inverter using two separately patterned semiconducting layers according to an embodiment of the present invention.

Fabrication of enhancement-depletion type logic circuits based on TFTs arranged as either both top-gate or bottom-gate configurations with different semiconductors 4 and 13, may require the patterning of at least one of the two semiconductors (FIG. 7). Preferably patterning is performed by a solution-based direct printing technique such as but not limited to inkjet printing, screen printing, flexographic printing, offset printing, laser printing, or laser forward transfer printing. Alternatively, techniques such as photolithographic patterning might be used. Most preferably, patterning is performed by ink jet printing. It is important that the thickness profile of the two semiconductor islands is sufficiently uniform over the active channel area of the transistors.

It is also possible to use device configurations, where only one of the two semiconductors is patterned and the other one is deposited as a continuous film analogous to the two-dielectric configuration described in FIG. 4. For bottom-gate configurations the patterned semiconductor needs to be deposited first, while in the case of top gate configuration the continuous semiconductor layer is deposited first. In both cases care needs to be taken to avoid dissolution and swelling during the deposition of the two semiconductors, for example, by using a precursor material for the first deposited semiconductor, or by judicious choice of solvents.

Figure 8:
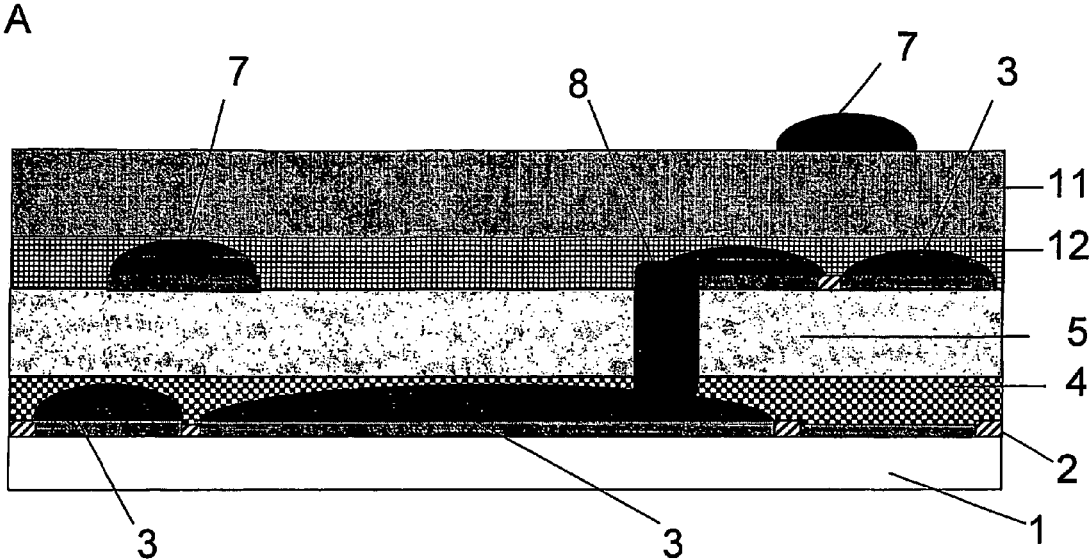
FIG. 8 shows a schematic diagram of an enhancement-depletion load inverter incorporating TFT's on multiple level.
Figure 8:
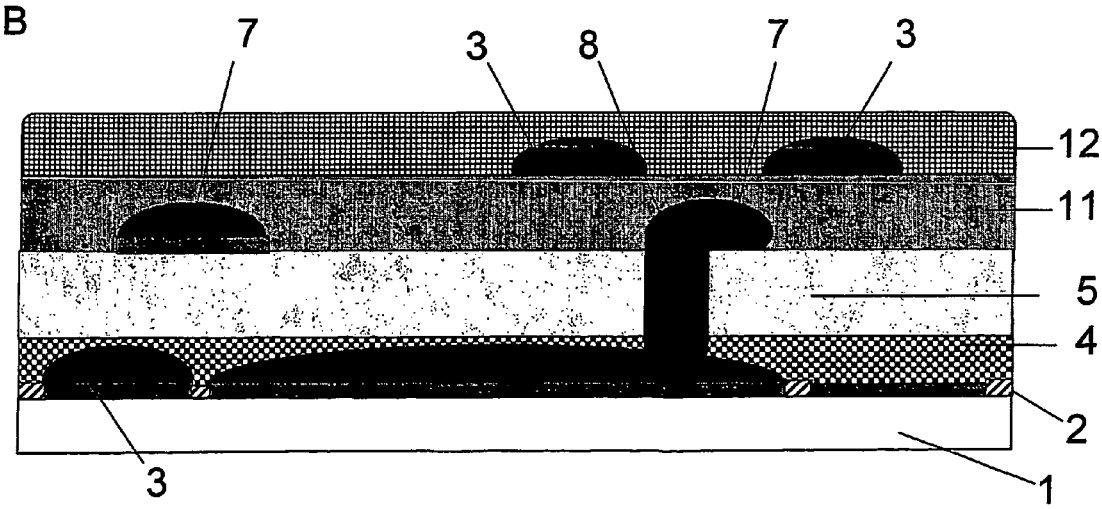

Alternatively, device configurations may be used incorporating TFT's on multiple levels. A configuration incorporating a combination of top-gate and bottom-gate configurations is illustrated in FIG. 8. As previously seen, in order to electrically connect transistors, via-holes 8 may be created between levels.

FIG. 8A shows two top-gate transistors that are incorporated within different levels of the structure. In this structure, the semiconductor layers 4, 12 and the dielectric layers 5, 11 are deposited alternatively throughout the structure. However, in FIG. 8B, the configuration consists of a top-gate and a bottom gate transistor. This structure consists of a double dielectric layer 5, 11 within the middle of the structure. These configurations have the advantage of being able to deposit the semiconductor layers in unpatterned form, for example by spin-coating.

Another embodiment of the present invention is an integrated circuit comprising normally-ON TFTs and normally-OFF TFTs integrated on the same substrate wherein the normally-ON TFTs have a different active interface modification layer than the normally-OFF TFTs.

It has been observed that the turn-on voltage of an organic TFT can be tuned by using different interface modification layers or different interface preparation techniques for the active semiconductor-dielectric interface.

In one example, a self-assembled monolayer (SAM) is deposited selectively onto the active region of one of the two transistors. The active region of the other transistor is either left unmodified, or is modified by patterned deposition of another SAM in the area of the other transistor, or is modified by deposition of another SAM over the whole area of the substrate. In the latter case the second SAM is chosen such that it does not modify the surface regions that have previously been modified by the first SAM.

An example for such a combination of SAMs used in combination with a $SiO_2$ gate dielectric, and P3HT semiconducting layer is a fluorinated SAM such as FDTS patterned in the active region of the normally-ON p-type devices, and a layer of octyltrichlorosilane deposited as a continuous film over the whole substrate afterwards. In the FDTS coated regions the devices exhibit normally-ON baheviour With turn on voltages between +5 and +40 V, while in the OTS regions the threshold voltage is close to zero. The patterning of the FDTS to modify selectively the active region of the normally-ON devices can be achieved by a range of different techniques, including but not limited to, soft lithographic stamping, ink jet printing of a solution containing the SAM, or deposition/patterning of a masking layer followed by exposure of the substrate to a solution/gas stream containing the SAM.

Alternatively, the surface modification might be performed selectively by a physico-chemical treatment such as a plasma treatment, for example an oxygen or a carbontetrafluoride ($CF_4$) plasma treatment. In this case the regions of the substrate that are not to be modified can be protected, for example, by a masking layer that is patterned either by an additive direct printing technique, such as inkjet printing, or by a subtractive patterning technique, such as photolithography.

Figure 9:
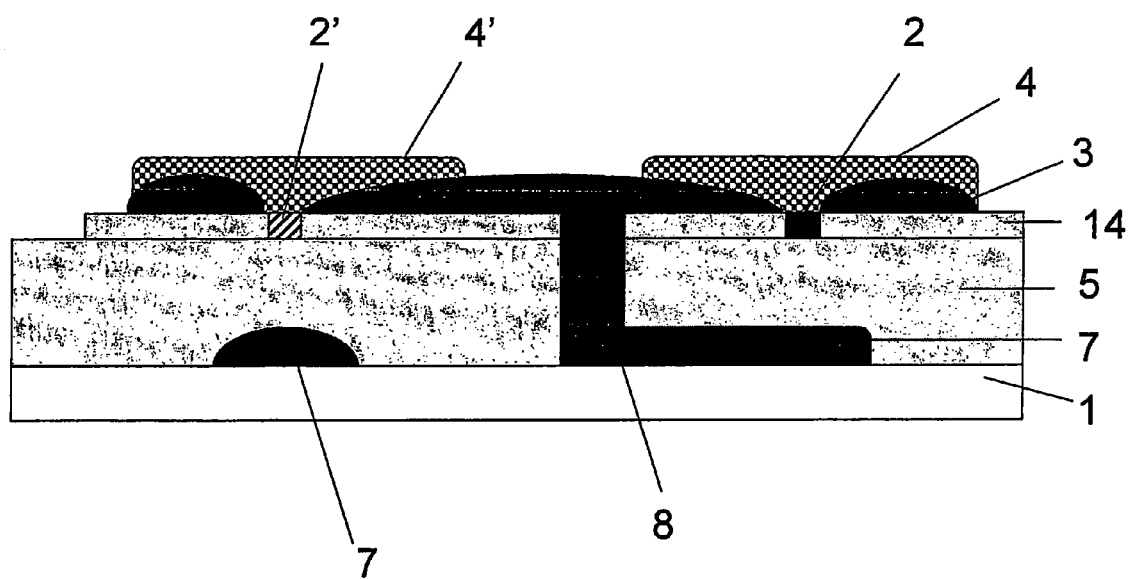
FIG. 9 shows a schematic diagram of an enhancement-depletion load inverter with patterned surface modification layer inducing a shift of the threshold voltage in one of the two TFT's according to an embodiment of the present invention.

FIG. 9 shows a schematic diagram of an inverter device with normally-ON and normally-OFF TFTs comprising different interface modification layers 2 and 2'. The surface modification layers have been patterned and deposited over the source and drain electrodes in a bottom gate configuration.

Another embodiment of the present invention is an integrated circuit comprising normally-ON TFTs and normally-OFF TFTs integrated on the same substrate wherein the normally-ON TFTs have a different gate electrode and or source/drain electrode than the normally-OFF TFTs.

It has been found that the turn-on voltage of organic TFTs depend significantly on the choice of the gate electrode. F8T2 TFTs with PVP gate dielectric and printed PEDOT/PSS gate electrode typically exhibit normally ON behaviour with turn-on voltage of +5V to +10V, whereas F8T2/PVP devices with a silver or gold gate electrode show normally OFF characteristics with a turn-on voltage of −1 V to −10V.

Without wanting to be bound by theory this difference in turn-on voltage is not believed to be caused primarily by the difference in work function between the different metals, which will only cause a small shift of the flatband voltage of the device. It is more likely that this significant difference in turn-on voltage might be caused by some interaction between the gate dielectric with the deposited metal, such as interdiffusion of metal ions into the gate dielectric or diffusion of ionic species. It was observed that the positive turn-on voltage of devices with printed PEDOT electrodes was sensitive to the conditions in which the step of inkjet printing of the gate electrode was being performed. If the printing was performed such that the PEDOT ink was drying slowly the turn-on voltage was more positive than under printing conditions where the drying time was short, such as for example for printing under a flow of dry nitrogen gas passing between the printhead and the substrate surface.

Figure 10:
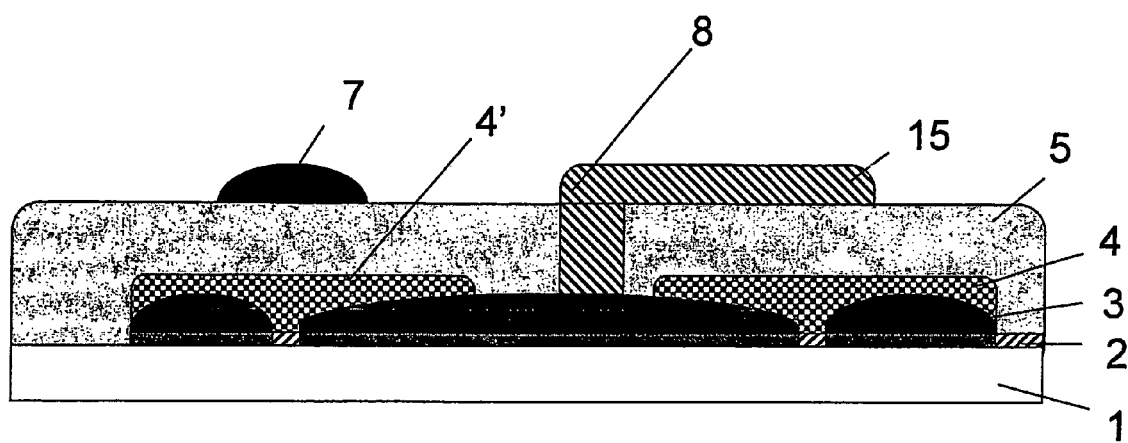
FIG. 10 shows a schematic diagram of an enhancement-depletion load inverter fabricated by using different gate electrodes for the load and inverter TFT according to an embodiment of the present invention.

FIG. 10 shows an inverter configuration with different gate electrode materials 7 and 15.

Figure 11:
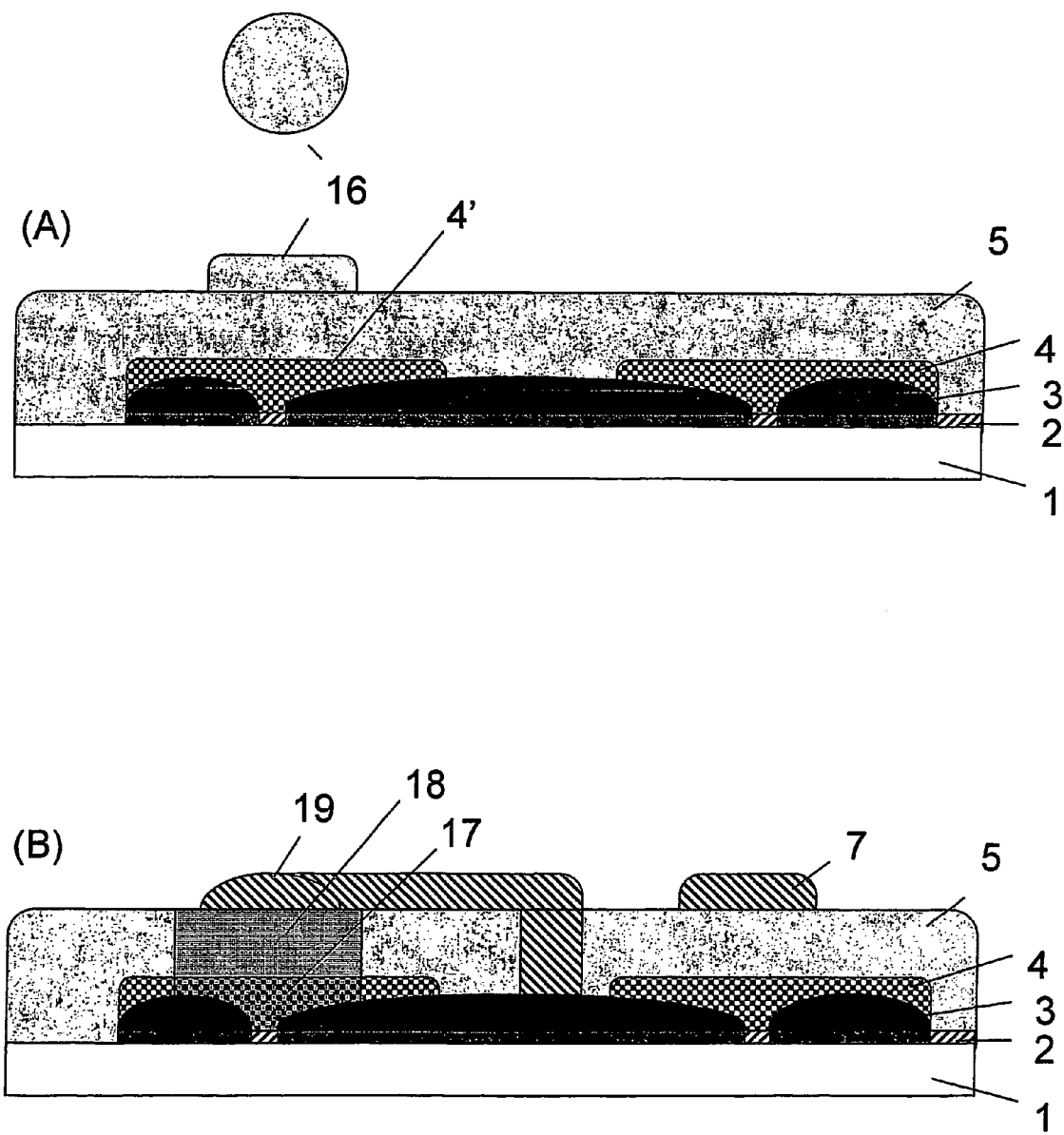
FIG. 11 shows a schematic diagram of an enhancement-depletion load inverter fabricated by exposing the load TFT to a chemical agent prior to deposition of the gate dielectric according to an embodiment of the present invention.

Another embodiment of the present invention is an integrated circuit comprising normally-ON TFTs and normally-OFF TFTs integrated on the same substrate wherein the normally-ON TFTs are exposed to a chemical agent that is deposited by a direct printing technique from solution, diffuses into the active region of the device and modifies the turn-on voltage of the TFT (see FIG. 11).

The chemical agent 16 is preferably a chemical dopant, such as small molecule or polymeric counterion that is capable to oxidatively p-type dope (or reductively n-type dope) the organic semiconductor active layer. Suitable p-type dopants are oligomeric units or polymers of styrene sulphonic acid, ferric chloride or other electron withdrawing agents known in the prior art.

Preferably, the chemical agent is deposited by a direct printing technique, most preferably the chemical agent is deposited locally by inkjet deposition. The step of depositing the chemical agent can be performed at different stages of the device manufacturing process. It can either be deposited in direct contact with the active semiconducting layer, either directly before or after the semiconductor deposition step. Alternatively the chemical agent might also be deposited on top of the gate dielectric and might then be made to diffuse through the gate dielectric to reach the buried semiconductor-dielectric interface. The step of diffusion through the gate dielectric might be aided by solvent exposure or by thermal treatment. After bringing the substrate in contact with the chemical agent, the substrate may be washed in a suitable solvent which does not dissolve the underlying layer(s), but washes off any excess chemical agent.

Alternatively, the chemical agent might also be used to modify the electrical characteristics of the gate dielectric. Depositing a solution of polystyrene sulphonic acid on top of a gate dielectric of PVP prior to deposition of a gate electrode of silver modifies the turn-on characteristics of the device to exhibit a positive turn-on voltage.

The chemical agent causes a chemical modification, such as chemical doping, of the region of the dielectric 18 and semiconductor 17 that leads to a shift of the turn-on voltage of the TFT. After deposition of the chemical agent, the gate electrode 19 is deposited.

Inverters comprising normally-ON load TFTs and normally-OFF switching TFTs can be used to fabricate both analog and digital circuits with improved performance compared to circuits that just comprise normally-OFF or normally ON devices. Compared to the enhancement-load configuration, in which the load TFT is operated in the triode region, the enhancement depletion load configuration offers a higher gain, due to the higher output impedance of the load. In contrast to the depletion load configuration the enhancement depletion load configuration does not require level shifting.

Alternatively, normally-On and normally-Off transistors that are integrated together may incorporate the same dielectric or semiconductor material. In this case, the dielectric or semiconductor material may be locally treated in order to produce transistors of the same material but of differing properties.

Transistors of the same dielectric or semiconductor material but differing properties may be produced by incorporating an underlying substrate layer within the device of a material that is capable of aligning the active material of one of the transistors. Alignment can be induced by shear forces or flow or by depositing the LC polymer onto a substrate with an alignment layer exhibiting a uniaxial anisotropy in the plane of the substrate. The alignment layer may be a mechanically rubbed organic layer such as polyimide (M. Grell, et al., Adv. Mat. 9, 798 (1998)), a layer evaporated at an oblique angle onto the substrate, or a layer with a grooved surface.

Alternatively, the semiconductor or dielectric material of one of the transistors may be exposed locally to light in order to change its chemical properties. The light exposure might be used for example to induce a photooxidation in the presence of oxygen in order to enhance the conductivity of the bulk of the semiconductor, and shift the turn-on voltage of the device to more positive values. Such photooxidation is observed when a semiconductor such as P3HT is exposed to visible or UV light in the presence of oxygen. Alternatively, the light exposure might also be used generate electronic traps in the semiconductor, which tend to shift the turn-on voltage of the device to more negative values, as more charge needs to be injected into the channel to fill all the traps. Such photoinduced shift of the turn-on voltage is observed in semiconductors such as F8T2, or TFB after prolonged exposure to UV light.

The local light exposure of either the normally-ON transistor regions might be effected with the help of a shadow mask blocking the region of the normally-OFF transistors from light, or by using a focussed beam or an array of focussed beams of light which can be scanned across the substrate to expose selectively certain regions of the substrate to light. The light is preferably a laser beam of well defined wavelength. Preferably, the light is of visible or ultraviolet wavelength to be absorbed by the organic semiconductor.

Figure 12:
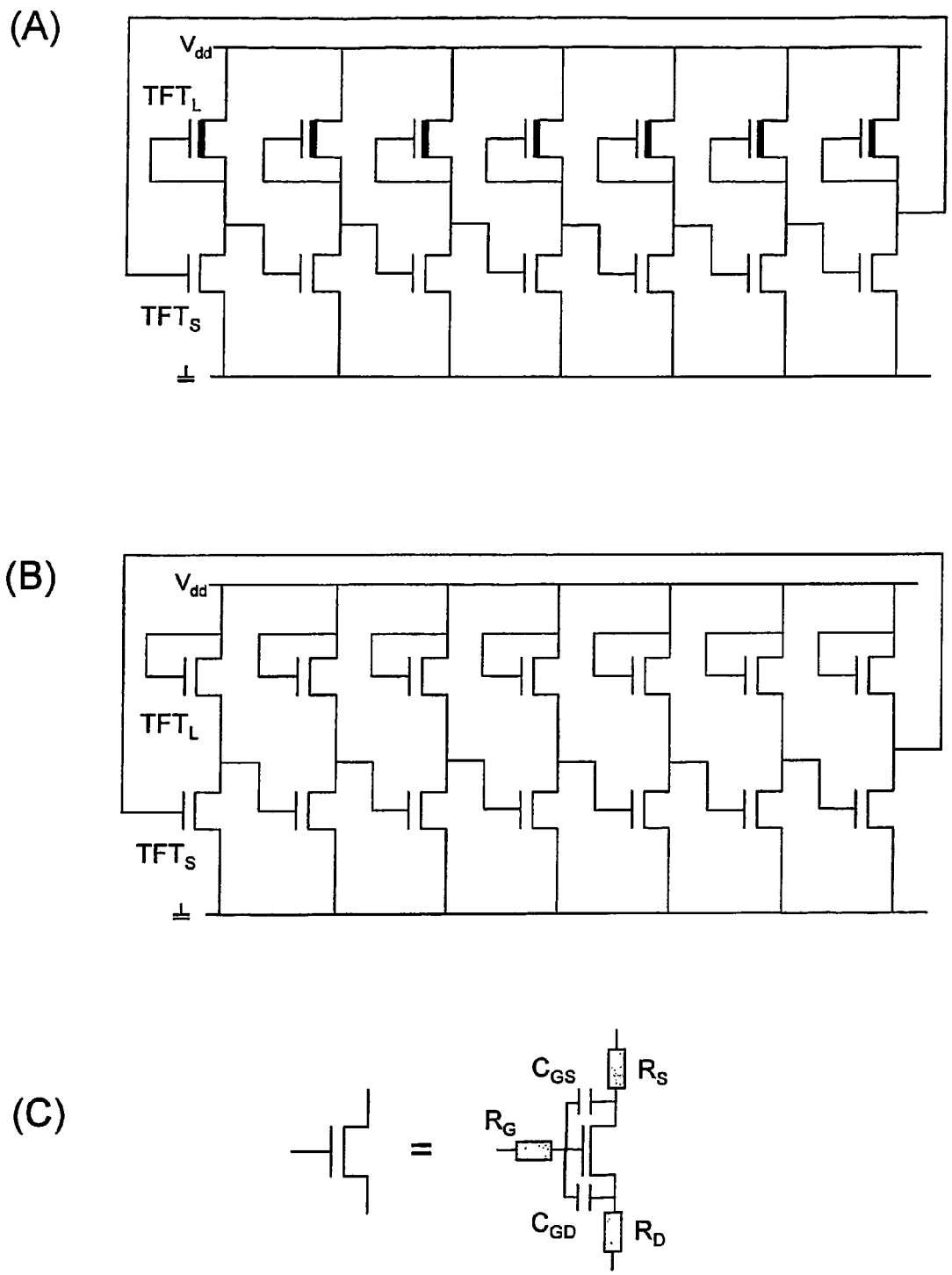
FIG. 12 shows a schematic diagram of a seven stage ring-oscillator in enhancement-depletion configuration (A) and enhancement-load configuration (B).
Figure 13:
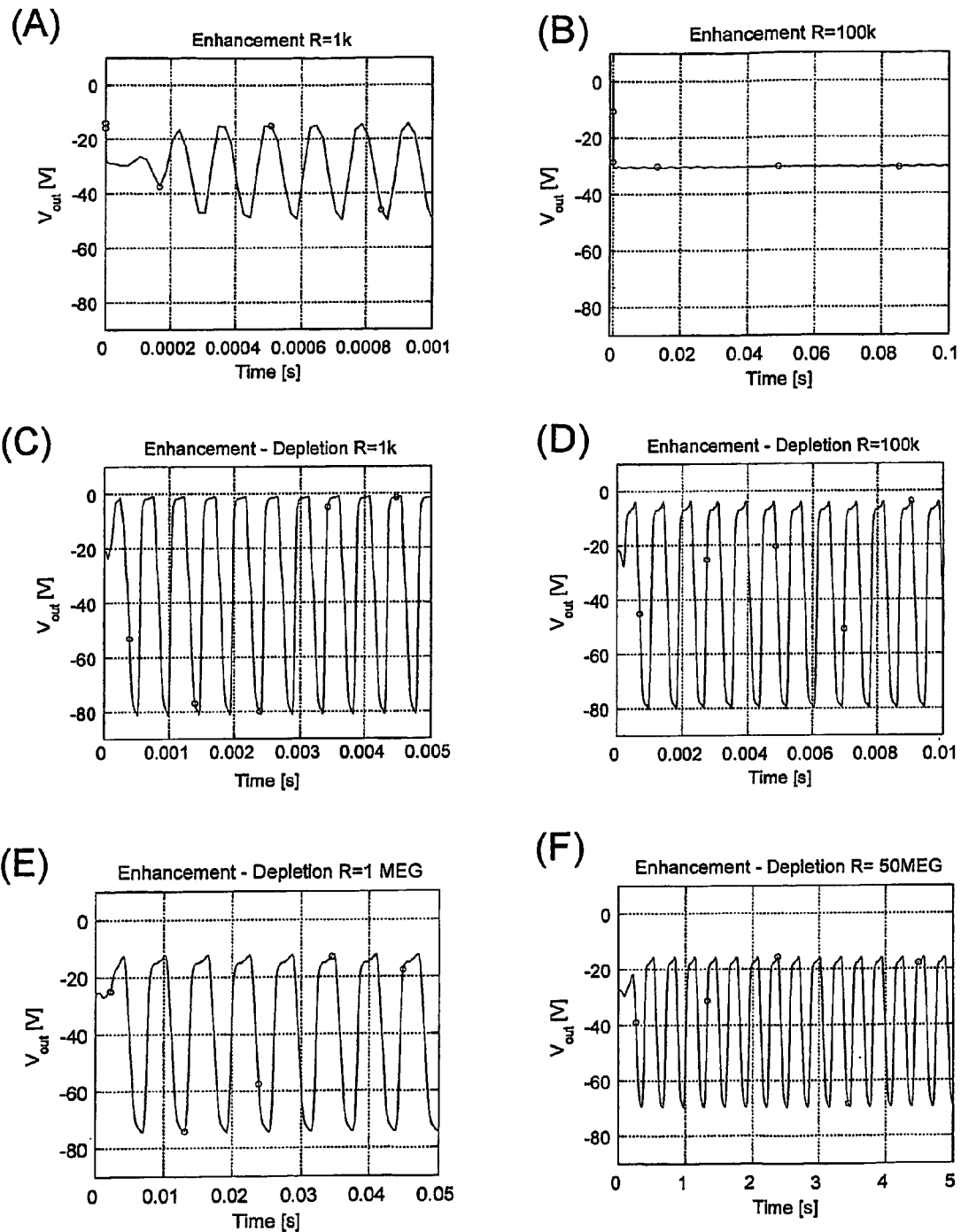
FIG. 13 shows SPICE circuit simulations of the enhancement-load ring oscillator (A-B) and the enhancement-depletion ring oscillator (C-F) of FIG. 10 for different conductivities R of the interconnect lines.

FIG. 12 shows a schematic diagram of a 7-stage ring oscillator using the enhancement-depletion load configuration according to an embodiment of the present invention (A), and the enhancement load configuration according to the prior art (B). FIG. 12 (C) shows an equivalent circuit diagram for the TFT including contact and interconnect resistances and parasitic capacitances. FIG. 13 shows SPICE circuit simulations of the two configurations. It can be seen that for the enhancement load configurations oscillations are not observed if the resistance R of the interconnects exceeds a few kΩ(A-B). However, for the enhancement-depletion load configuration oscillations are observed even if the interconnect resistance exceeds several 10 MΩ(C-F) This is believed to be due to the higher gain of the basic inverter stage.

Figure 14:
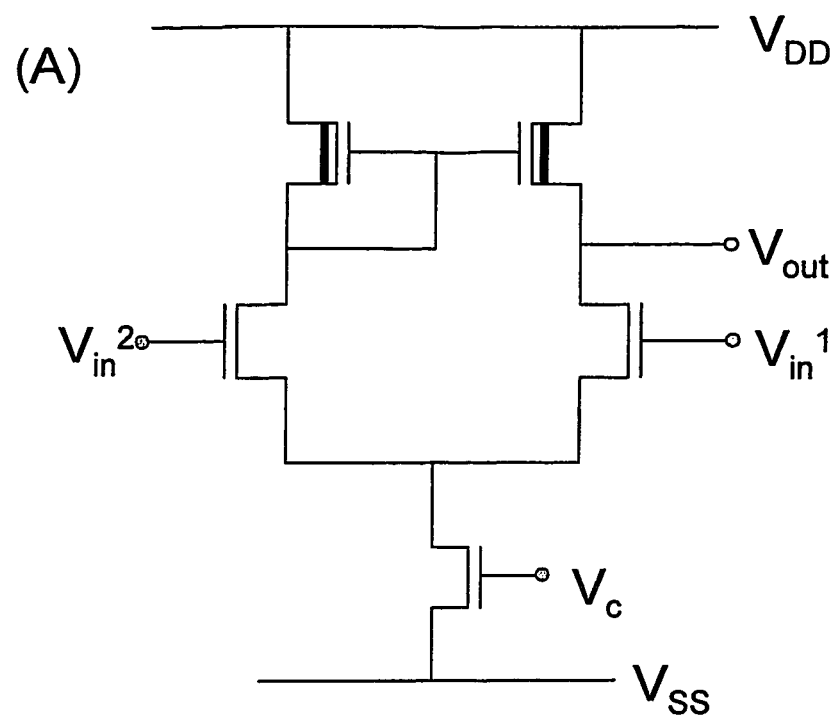
FIG. 14 shows a schematic diagram of a possible configuration for an enhancement-depletion differential amplifier (A) and a SPICE simulation of the gain of the amplifier assuming the normally-ON and normally-OFF devices to have turn-on voltages of +5V, and −5V, respectively.
Figure 14:
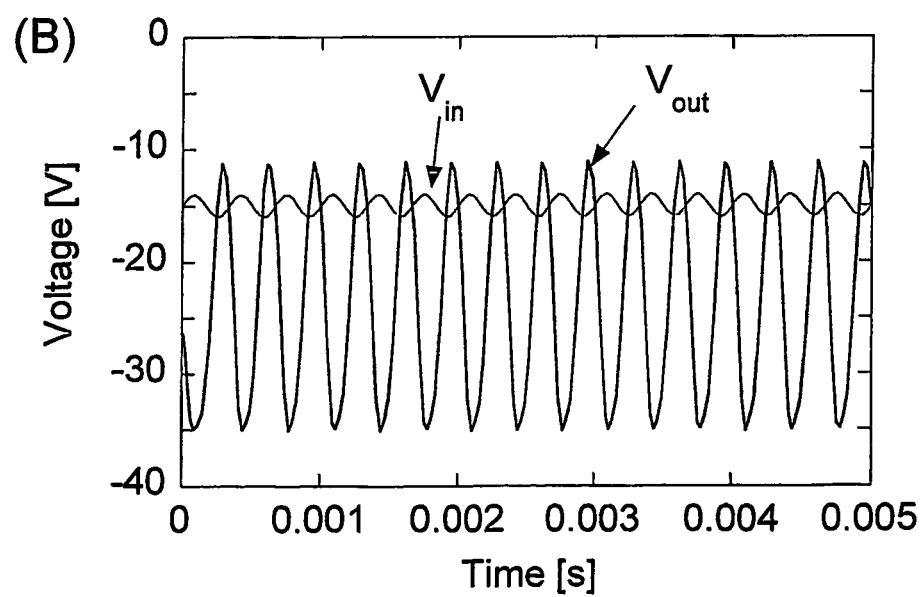

As an example of an analogue circuit a simple differential amplifier is shown in FIG. 14 using both normally-ON and normally-OFF TFTs. The device amplifies the difference between the input signals $V_1$-$V_2$. Such a device or a similar amplifier can be used in sensor devices where a small signal generated by a sensing element needs to be amplified before being able to process the signal using digital logic. FIG. 14(B) shows a SPICE simulation of the circuit using values for the threshold voltage of the normally-ON device of +5V, and −5V for the normally-OFF device. The amplifier shows a high signal gain of >10.

The processes and devices described herein are not limited to devices fabricated with solution-processed polymers. Some of the conducting electrodes and/or interconnects may be formed from inorganic conductors, that can, for example, be deposited by printing of a colloidal suspension or by electroplating onto a pre-patterned substrate. In devices in which not all layers are to be deposited from solution one or more layers of the device may be replaced with a vacuum deposited material, such as for example vacuum deposited pentacene. One of more layers of the device might also be patterned by conventional photolithographic techniques.

For the semiconducting layer solution processible conjugated polymeric or oligomeric materials that exhibit adequate field-effect mobilities exceeding $10^{-3}$ $cm^2$/Vs, preferably exceeding $10^{-2}$ $cm^2$/Vs, are preferably used. Suitable materials are reviewed for example in H. E. Katz, J. Mater. Chem. 7, 369 (1997), or Z. Bao, Advanced Materials 12, 227 (2000). Other possibilities include small conjugated molecules with solubilising side chains (J. G. Laquindanum, et al., J. Am. Chem. Soc. 120, 664 (1998)), semiconducting organic-inorganic hybrid materials self-assembled from solution (C. R. Kagan, et al., Science 286, 946 (1999)), or solution-deposited inorganic semiconductors such as CdSe nanoparticles (B. A. Ridley, et al., Science 286, 746 (1999)) or semiconducting nanowires (Duan, Nature 425, 274 (2003)).

The techniques described here primarily for p-type polymer semiconductors can analogously be applied to non-CMOS enhancement-depletion circuits that contain n-type semiconductors only, both polymer as well as small molecule semiconductors.

The electrodes and other layers may be coarse-patterned by techniques other than inkjet printing. Suitable techniques include soft lithographic printing (J. A. Rogers et al., Appl. Phys. Lett. 75, 1010 (1999); S. Briftain et al., Physics World May 1998, p. 31), screen printing (Z. Bao, et al., Chem. Mat. 9, 12999 (1997)), and photolithographic patterning (see WO 99/10939), offset printing, flexographic printing or other graphic arts printing techniques. Ink-jet printing is considered to be particularly suitable for large area patterning with good registration, in particular for flexible plastic substrates.

Although preferably all layers and components of the device and circuit are deposited and patterned by solution processing and printing techniques, one or more components may also be deposited by vacuum deposition techniques and/or patterned by a photolithographic process.

The present invention is not limited to the foregoing examples. Aspects of the present invention include all novel and/or inventive aspects of the concepts described herein and all novel and/or inventive combinations of the features described herein.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. An electronic device including at least first and second transistors integrated together on a substrate and each including an organic semiconductor region,
wherein the first and second transistors are both p-type but wherein one of the first and second transistors is a normally-ON transistor and the other of the first and second transistors is a normally-OFF transistor, and wherein each transistor comprises a semiconductor region coupled to a gate electrode via a dielectric region, and the dielectric regions of the two transistors are different from each other in terms of at least one property thereof;
wherein the dielectric regions have different chemical compositions; and
wherein said dielectric region of said normally ON-transistor contains an electron withdrawing group.

2. The device according to claim 1, wherein said electron withdrawing group is a fluorine, chlorine, bromine, hydroxyl or cyano-containing group.

3. The device according to claim 1, wherein, the dielectric regions comprise different organic materials.

4. The device according to claim 1, wherein the electron-withdrawing group stabilises the formation of a hole accumulation layer at an interface between the organic semiconductor region of said normally-ON transistor and the dielectric region of said normally-ON transistor.

5. An electronic device including at least first and second transistors integrated together on a substrate and each including an organic semiconductor region,
wherein the first and second transistors are both n-type but wherein one of the first and second transistors is a normally-ON transistor and the other of the first and second transistors is a normally-OFF transistor, and wherein each transistor comprises a semiconductor region coupled to a gate electrode via a dielectric region, and the dielectric regions of the two transistors are different from each other in terms of at least one property thereof;
wherein the dielectric regions have a different chemical compositions; and
wherein said dielectric region of said normally ON-transistor contains an electron donating group.

6. The device according to claim 5, wherein said electron donating group comprises a metal atom, such as an alkali atom.

7. The device according to claim 5, wherein the dielectric regions comprise different organic materials.

* * * * *